United States Patent [19]

Fitzgerald

[11] Patent Number: 4,742,383
[45] Date of Patent: May 3, 1988

[54] MULTI-FUNCTION FET MASTERSLICE CELL

[75] Inventor: Joseph M. Fitzgerald, Rochester, Minn.

[73] Assignee: International Business Machines Corporation, Armonk, N.Y.

[21] Appl. No.: 818,981

[22] Filed: Dec. 30, 1985

Related U.S. Application Data

[63] Continuation of Ser. No. 457,324, Jan. 12, 1983, abandoned.

[51] Int. Cl.[4] .................... H01L 27/10; H01L 29/78; H01L 23/52; H01L 29/06
[52] U.S. Cl. ........................... 357/45; 357/41; 357/68; 307/465
[58] Field of Search ............... 357/45, 41, 68, 40, 357/65, 71; 307/207, 213

[56] References Cited

U.S. PATENT DOCUMENTS

| 3,943,551 | 3/1976 | Skorup | 357/42 |
| 4,161,662 | 7/1979 | Malcolm et al. | 357/42 |
| 4,356,504 | 10/1982 | Tozun | 357/42 |

FOREIGN PATENT DOCUMENTS 53-123684  10/1978  Japan ..................... 357/45

OTHER PUBLICATIONS

Kraft et al., IBM Technical Disclosure Bulletin, vol. 22, No. 2, Jul., 1979, p. 447.

Primary Examiner—Andrew J. James
Assistant Examiner—John Lamont
Attorney, Agent, or Firm—J. Michael Anglin

[57] ABSTRACT

A cell layout provides a practical masterslice design for random logic in any LSI FET technology. Each cell is capable of the order of about 20 different functions at any of several different power levels. Multiple cells can be combined to form standard macro functions.

10 Claims, 7 Drawing Sheets

MULTI-FUNCTION FET MASTERSLICE CELL

This is a continuation of application Ser. No. 457,324, filed Jan. 12, 1983, now abandoned.

TECHNICAL FIELD

This invention relates to large-scale integration (LSI) field-effect transistor (FET) circuits and more particularly to a masterslice design for random logic in any LSI FET technology.

BACKGROUND OF THE INVENTION

LSI construction of complex circuit design provides a compact solution to circuit problems by the high packing density available in this art. This is in large part attributable to the very high percentage of the total volume consumed in the interconnecting wiring and connecting plugs required in older and more conventional designs utilizing external wiring between standard element chip packages. Since an extremely great number of circuit components must be contained on one substrate in the LSI circuit, the manufacturing process is much more complex than with a conventional circuit. As a result, the custom approach to a maximum utility of the area of the substrate by individually designing the component location and metallization connection for each required circuit is much more difficult in the LSI field than in smaller ICs.

In order to remove this deficiency present in the custom approach, a masterslice concept was developed for bipolar devices. With the masterslice concept or approach all wafers can be processed exactly alike up to the personalizable levels, and then stockpiled. Since personalization requires only a few process steps, this provides a significant reduction in the turnaround time. The masterslice concept also lends itself to auto-place and auto-wire programs which reduce the design cycle for a particular chip. Other advantages include array-like yields and lower cost for releasing each individual circuit design.

One customizing approach is described in U.S. Pat. No. 3,983,619, in which an LSI chip is made of an array of unit cells. All of the unit cells on the chip perform the same logical function, that is, AND, NAND, or OR. The unit cells are simple depletion-load circuits. No provision is made for powering up, that is, for having more than one power level in the unit cell. Another approach is described in U.S. Pat. No. 4,141,662, in which an LSI chip contains a fixed number of different logic functions. There are 72 NAND logic cells and 32 D flip-flop cells on the chip. No provision is made for powering up the logic cell.

Another approach is described in the IBM Technical Disclosure Bulletin Vol. 22, No. 5, October 1979, page 2018 to 2020 which utilizes a master image. Each part number generated using this technique has a unique set of masks; no processing of a wafer can be started until the unique set of masks for the given part number is submitted to the processing group. That is, the master-image concept only specifies where individual cells can be placed, and does not specify any FETs or other contents of the cells. With this technique, none of the wafer processing can be completed prior to the submission of a release for each individual circuit design.

One master-slice approach that has been utilized with FET devices is described in the IBM Technical Disclosure Bulletin Vol. 22, No. 2, July 1979, page 447. A flexible FET logic cell is personalized at the contact level and at the first metal level. This allows for six logical functions. This technique uses a single depletion load circuit and does not offer any provision for powering up the logic cell. Moreover, this design requires extra processing steps, since contact vias already formed must be later specifically opened during personalization.

SUMMARY OF THE INVENTION

A cell layout provides a practical masterslice design for random logic in any LSI FET technology. Each cell is capable of the order of about 20 different functions at any of several different power levels. Multiple cells can be formed to form standard macro functions. The total number of processing steps is not any greater than required for previous custom chip designs. Conventional technology is used; no new processes or fabrication is required.

With this masterslice design the first six mask levels are common for all part numbers. All the process steps associated with the six mask levels can be completed and the wafer can be stockpiled and later personalized with the last four mask levels for a given part number. This design can use push/pull circuits for logic functions to provide a significant power-performance advantage over the simple depletion-load circuits. A single layer of conductors is sufficient to personalize any cell or macro function, so that any further conductor layer is free to run anywhere on the chip for intercell wiring.

DRAWING

DESCRIPTION OF A PREFERRED EMBODIMENT

Figure 1:
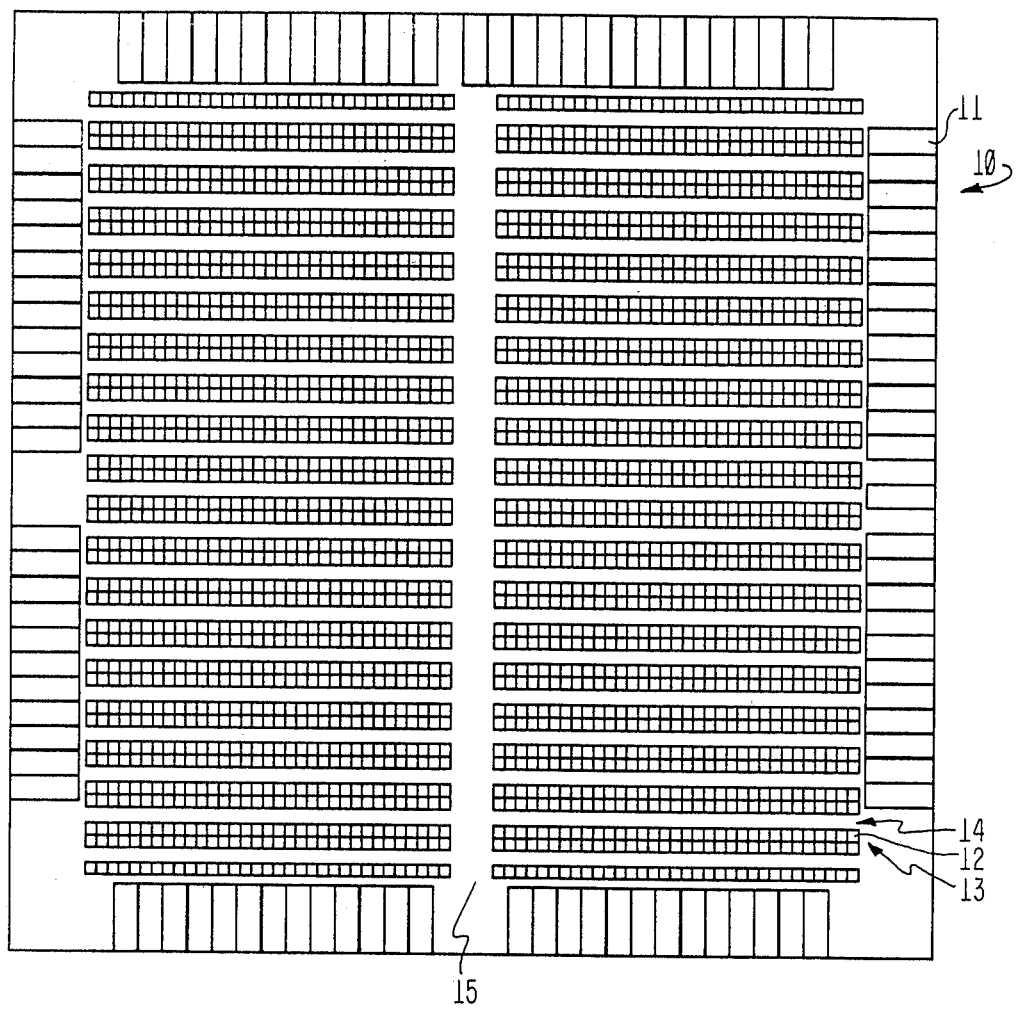
FIG. 1 shows the overall layout areas of an integrated-circuit chip according to the invention.

FIG. 1 shows the overall layout of an entire masterslice chip 10, having dimensions about 6.2 mm square. The chip preferably uses conventional silicon-gate N-channel field-effect-transistor (FET) technology. About 100 areas such as 11 around the chip edges contain input-output cells having circuits and contacts for transmitting signals between the chip and external conductors on a substrate, not shown. These I/O cells may be conventional, or they may have a design created especially for this chip but not forming a part of the present invention.

About 2500 internal standard cells such as 12 contain circuits which can be personalized to perform various logic functions, either individually or in contiguous groups or macros of up to four cells. (Larger macros can also be defined, however.) The term "cell" by itself will hereinafter refer only to the standard cells 12. These cells are arranged in lines such as 13; most of the lines are disposed in back-to-back pairs for easier power distribution. Wiring bays such as 14 run between the lines for inter-cell signal distribution at the first conductor level. Bay 15 carries conventional major power buses.

Figure 2:
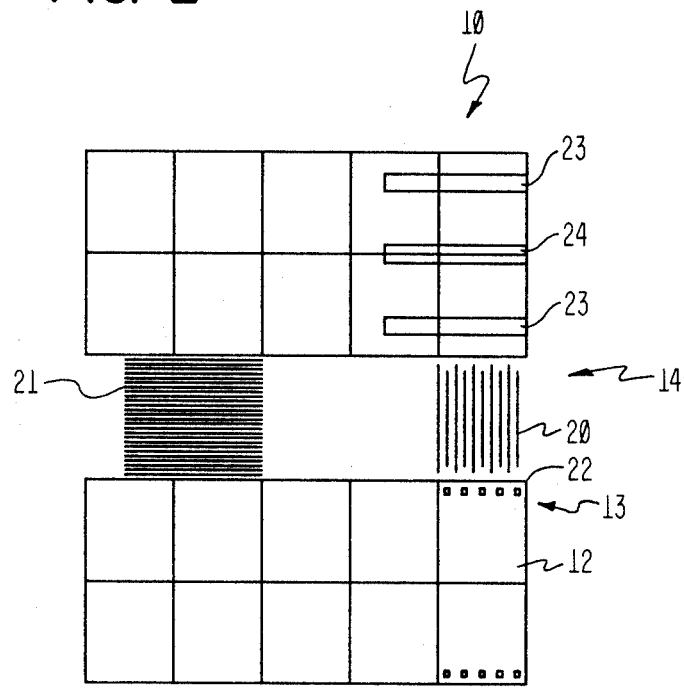
FIG. 2 illustrates power busses, inter-cell wiring, and cell I/O connections at the personalized upper layers of the chip.

FIG. 2 details a small portion of chip 10. Proceeding from the top down toward the substrate, second-level metal (M2) conductors such as 20 run vertically over the cell lines 13 as well as over bays 14-15 to distribute signals. These conductors may be spaced as closely as allowed by the technology; presently 2-micron photolithography is used. Separated from second metal by an insulating layer, similar first-level metal (M1) conductors such as 21 run horizontally in the bays 14 between the cell lines 13. Cell I/O contacts such as 22 at this level may connect either directly to conductors 21 or through vias in the superjacent insulating layer to conductors 20. First-metal conductors 21 and second-metal conductors 20 can also couple to each other through vias, thus forming a two-dimensional matrix of signal wiring. As will be shown and described later, the first-metal layer further contains a ground bus 23 for each cell line, a supply-voltage (Vdd) bus 24 for each pair of lines, and conductors within the cells for personalizing their functions. The details of chip 10 and its layout are exemplary, and may obviously be varied to suit other conditions. Background information on the technology used in the chip may be found in Donze, et al., "Philo—A VLSI Design System", *ACM/IEEE Nineteenth Design Automation Conference Proceedings,* 1982 (ISSN 0146-7123, Library of Congress No. 76-150348).

Before discussing the layout of the individual cells, the purposes of the various layers on chip 10 will be discussed. These layers and fabrication steps are conventional, and are briefly summarized here only to facilitate an understanding of how the cell configuration of the invention may be achieved in a particular technology.

The raw silicon chip is first coated with oxide and nitride layers. A photoresist mask RX defines where the nitride is etched away; the nitride remains on areas which will become channel regions for the FETs. At this time, a boron field implant raises the threshold voltage of unwanted parasitic FETs so that they will never conduct. The oxide layer is then regrown to a greater thickness where it is not covered by the nitride, the nitride and enough oxide are removed to expose the silicon in the channel regions, and a thin oxide layer is regrown. A photoresist mask DL leaves open the channels of the load devices, and implanted arsenic ions convert only those channels to depletion mode for the DFET devices. A mask BC defines buried-contact areas, formed by etching away the thin oxide in the channel areas exposed by the mask. A polysilicon ohmic conductive layer is deposited, and another oxide layer is formed above it. These two layers are etched with a mask P1 to define the FET gate electrodes. The poly also drops through the oxide holes previously defined by the BC mask, to form the actual buried contacts. (Phosphorous from the polysilicon can then be diffused into the buried-contact areas to increase their conductivity and to define the adjacent channel edges, if desired.) Arsenic is implanted through the thin oxide around the gates in the channels, to provide N+ doped source and drain electrodes for the FETs (usually called the "diffusion layer", even though it is now normally implanted instead of diffused). An oxide layer is then deposited over the chip. A mask C1 defines vias etched through the last-named oxide to open contacts with the poly layer and the source/drain layer. A mask C2 for the same layer defines vias etched much more deeply around the chip edges extending all the way to the substrate for purposes not related to the invention.

The standard cells of the chip are complete at this point, and can be stockpiled pending personalization. For better protection over long periods, they could alternatively be stockpiled before the last-named vias are opened up, or a metal layer could be deposited over the whole chip, then stripped off before further processing is begun.

Personalization begins with a mask M1 to define ohmic conductors (such as AlCuSi or similar metal) for wiring both inside the cells 12 and between cells within the lines 13 to form macros, and also in the bays 14 for inter-cell or inter-macro wiring. The conductors can be defined either by deposition, masking, and subtractive etch; or by masking, deposition, and lift-off of unwanted metal; both of these are conventional processes. A nitride layer is then deposited on the chip, and a mask NV defines vias etched through the nitride to first-metal conductors, and also to the foregoing vias to lower layers. A thick polyimide layer over the nitride reduces the capacitance between first-metal conductors and the second-metal conductors yet to come. A mask PV defines vias through this layer in the same positions as those in the nitride below. A mask M2 defines ohmic conductors in the same manner and composition as the first-metal layer, to form the second-metal layer conductors. These latter conductors link up to the NV/PV vias to provide inter-cell wiring as described elsewhere. It should be noted again that all intra-cell and intra-macro wiring can be achieved totally within the first-metal layer, so that second-metal is free to run anywhere on the chip, not only within prescribed bays or other restricted areas (although bays 15 are usually reserved for power distribution). Finally, a second polyimide protective layer is laid down, and a mask TV defines vias for connecting off-chip terminals such as solder-ball or C4 contacts; these are not relevant to the invention.

An outline of the mask sequence gives a good overview of the entire process:

RX defines the FET source/drain/channel "diffusion" bodies of the FET devices.

DL defines which FETs are to be DFETs.

BC defines the buried-contact vias for connecting the FET bodies to the gate regions.

P1 defines the polysilicon FET gates.

C1 defines contact vias for connecting first-metal to polysilicon and vias from first-metal to diffusion.

C2 defines contact vias to substrate for other purposes. (The above are common to all chips; the following masks serve to personalize each chip.)

M1 defines first-level wiring, both intra- and inter-cell.

NV and PV define vias for connecting second-metal to first-metal.

M2 defines second-level inter-cell wiring.

TV defines off-chip connection points.

The names of these masks are sometimes also used herein to designate the chip layers which they affect, or the vias which they define in a layer; the exact meaning will be obvious from the context.

Figure 3:
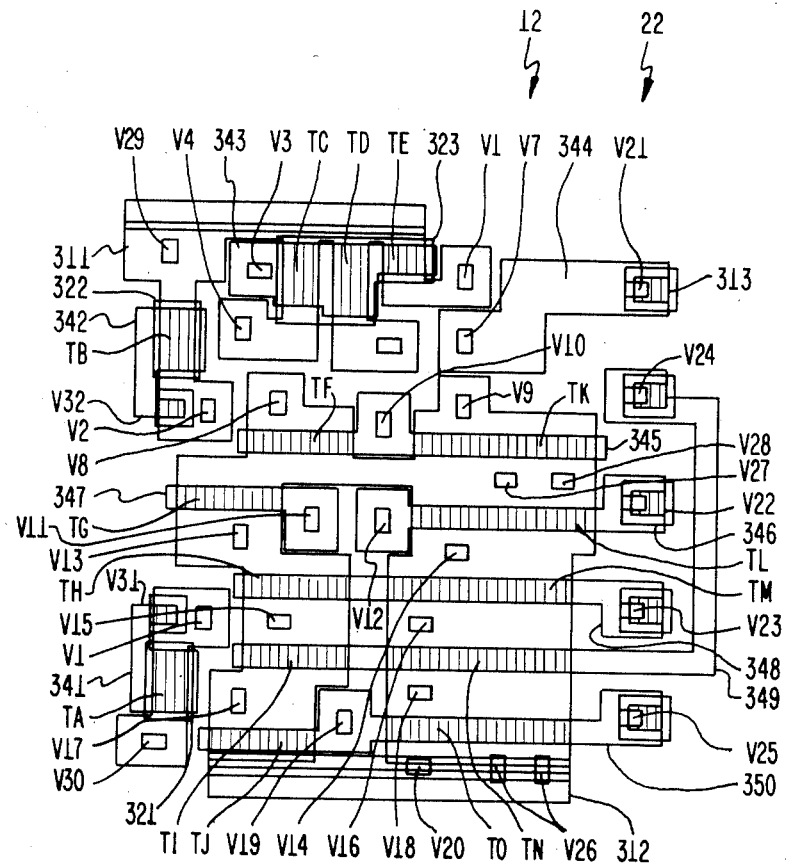
FIG. 3 shows the common lower layers of one standard cell of the chip.

FIG. 3 is a top view of the lower, common layers of a representative standard cell 12. This configuration is the same for all such cells, except for quadrantal symmetry; that is, a cell to the left of the one shown in FIG. 3 would be reversed about a vertical axis, a cell above the one shown would be reversed about a horizontal axis, and one diagonally up and to the left would be reversed about both axes.

The lowermost layer used in the cell 12 is the RX diffusion layer 31, having the shading indicated in the box in FIG. 3. A shape 311 of RX layer 31 provides channels, and source and drain conductors as well, for multiple load transistors TA-TE. The large shape 312 provides channels, sources, drains and certain fixed interconnections for logic transistors TF-TO. The set of small shapes such as 313 underlie the cell I/O pads V21-V25; their purpose is merely to drain away static charges to the substrate, thus protecting the overlying pads. The boron implant layer DL 32, shown unshaded, changes the conductivity of certain transistor channels, to convert them to depletion types (DFETs); all other transistors remain enhancement types (EFETs). DL implant shapes 321 and 322 convert TA and TB, while a single shape 323 serves for three transistors, TC-TE. The next layer, is an insulating layer having masked via holes 33 defining buried contacts (BC) between the RX diffusion layer and the next layer (polysilicon) or subsequent conductive layers. These vias, V1-V30, form the contact points by which the cell is personalized and by which it is connected to other cells. They are shown as small unshaded rectangles in FIG. 3. A polysilicon layer 34 forms the gate electrodes for all the cell transistors. Wherever a poly shape overlies an RX shape, a FET exists. Poly shape 341 forms transistor TA and provides a gate-to-source short through internal via V31; shape 342 does the same for TB, using via V32. Shape 343 provides gates for TC-TE. Area 344 merely connects V7 and V21, since no RX shape underlies it. Area 345 forms gates for TF and TK, and couples them together and to contact via V10. Areas 346-350 form gates for the remaining FETs, and connect them to each other, to via holes, and to cell I/O pads 22; the I/O pads use vias V21-V25. Next, an insulating layer has vias 35 for connecting the conductors to the superjacent first-metal layer for personalization. These vias are also shown as small unshaded rectangles. In addition, C1 contains a via wherever there is a buried-contact (BC) via, that is, overlying the vias V1-V30 (but not the internal vias V31-V32).

Note that shape 312 actually forms two vertical ("diffusion") columns interconnected at both ends. Poly shapes 345-350 form horizontal rows intersecting these columns and leading to the cell I/O pads. This forms a rectangular grid of EFETs for use as logic devices in the cell.

Representative dimensions, in microns, are given below for each of the cell FETs. Greater widths and lesser lengths both increase the power level of an FET.

| Transistor | Type | Width | Length |
| --- | --- | --- | --- |
| TA | DFET | 3.80 | 5.02 |
| TB | DFET | 3.80 | 6.52 |

-continued

| Transistor | Type | Width | Length |
| --- | --- | --- | --- |
| TC | DFET | 3.80 | 7.52 |
| TD | DFET | 3.80 | 7.52 |
| TE | DFET | 4.30 | 3.02 |
| TF-TJ | EFET | 13.78 | 2.22 |
| TK-TO | EFET | 24.80 | 2.22 |

Figure 4:
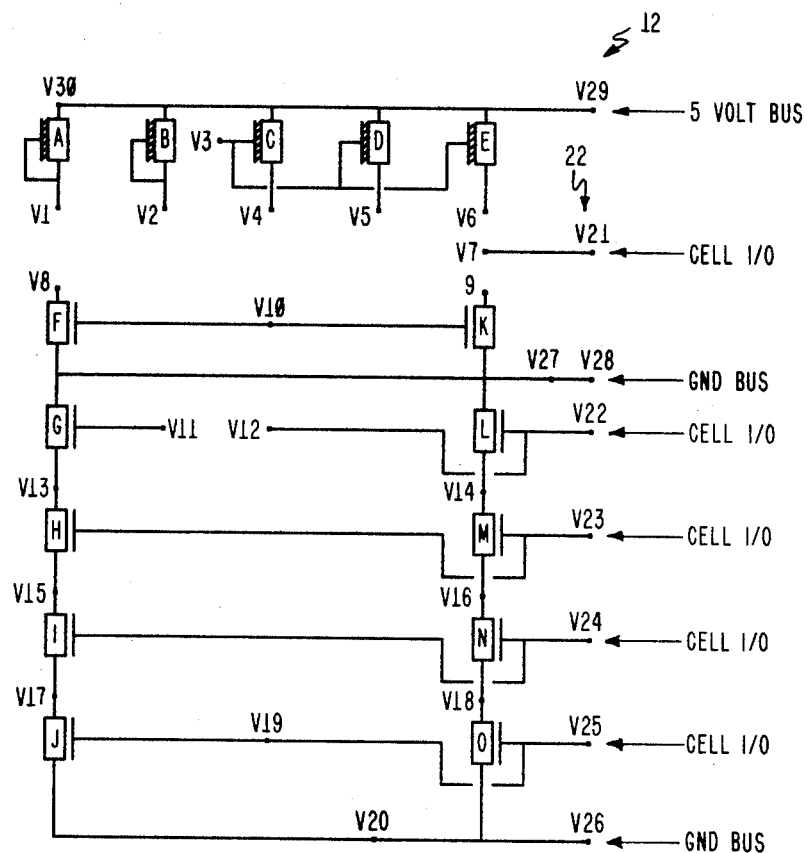
FIG. 4 is a schematic diagram of a standard cell before personalization.

FIG. 4 shows the circuit schematic of a single cell 12. This circuit is the same for all cells 12; the layout of FIG. 4 somewhat follows the physical configuration of the representative cell shown in FIG. 3, for easier visualization. Transistors TA-TO and contact vias V1-V30 carry the same designations as in FIG. 3. TA-TE form a group of depletion FETs (symbolized by the diagonal bars between gate and channel) personalizable in several different configurations for use as shorted-gate load devices. The gates of TA and TB are permanently shorted to their sources, while the gates of TC-TE are coupled together but left floating. The drains of TA-TE are tied together and to via V29 for permanent connection to a positive supply bus at the first-metal layer. V30 connects TA to the supply bus permanently. The junctions between TF, TG and TK, TL are held at ground potential by the top horizontal bar of shape 312 and paralleled vias V27, V28 for permanent connection to a ground bus at the first-metal layer. The sources of TJ and TO are likewise held at ground level by the lower bar of shape 312 and V26. V20 provides an intra-cell ground connection for the personalized levels yet to come. The gates of TH, TM, TI, TN, TJ, and TO are coupled in pairs to three of the cell I/O pads 22 at vias V23-V25. The TG, TL gate connection is interrupted by V11, V12, and only the latter is tied to I/O via V22. The TF, TK pair are paralleled and brought to intra-cell contact V10. As stated previously, I/O pad via V21 is coupled only to V7 for intra-cell use.

The logic transistors TF-TO of cell 12 constitute two parallel columns of series-connected EFETs, whose gates are disposed in horizontal rows to form pairs of related devices in a grid. All of the inter-device connections are available for personalization at the first-metal level, either by the aforementioned contact vias or by contact vias V13-V18 along the columns. Thus, even though some specific connections are permanently made in the common layers of all cells on the chip, others, including the source/drain electrodes of the logic transistors, are made available. It should be specifically noted here that the source and drain electrodes of these FETs (as is true of most FET devices) are physically interchangeable, and depend only upon the relative voltage levels within the devices.

Figure 5:
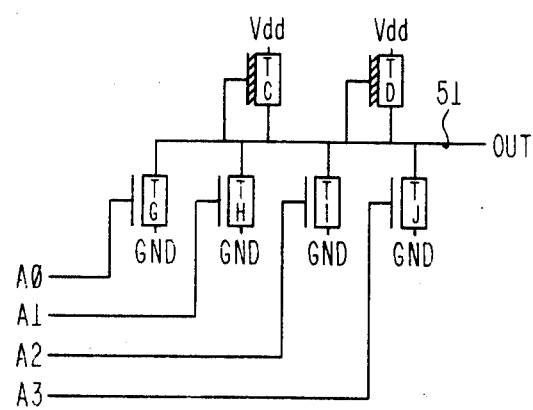
FIG. 5 is a schematic of a cell after personalization for a specific logic function and power level.

FIG. 5 is a schematic of a cell such as 12 after personalization as a four-input NOR gate at a low power level. The four input signals A0-A3 from cell I/O pads 22 are tied to the gates of logic transistors TG-TJ. The sources of these transistors are at ground potential, while their drains are paralleled to the source of shorted-gate load transistors TC-TD whose drains are tied to Vdd. Thus, a high voltage level on any of the input signals pulls node 51 to ground; node 51 is high only when no input is active. Node 51 is tied directly to an I/O pad as the cell output, labelled OUT.

Figure 6:
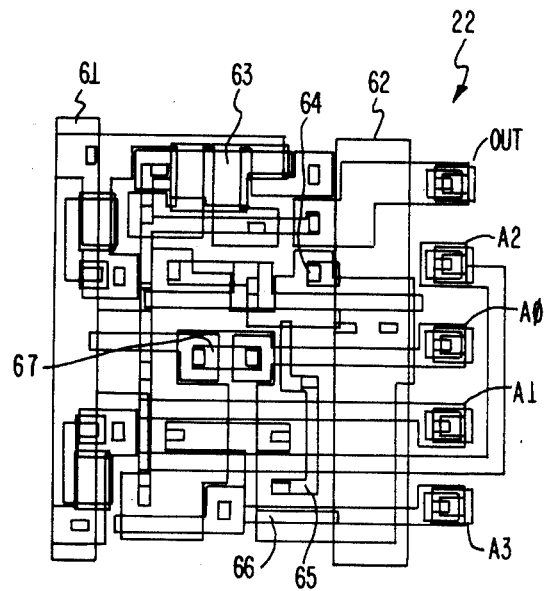
FIG. 6 is a top view of the personalized first metal layer for the cell of FIG. 5.

FIG. 6 shows the personalized wiring pattern at the shaded M1 metal layer for achieving the low-power NOR gate of FIG. 5. The Vdd supply-voltage bus 61 and the ground bus 62 are the same for all cells, as stated previously. Output node 51 goes from the uppermost I/O pad 22 under bus 62 to metal 63, which connects it to the sources of load transistors TC-TD and to the drains of logic transistors TG-TJ. Metal fingers 64-66 ensure that both the sources and drains of the remaining, unused transistors are connected to ground bus 62. Link 67 couples the gates of TG and TL together.

Figure 7:
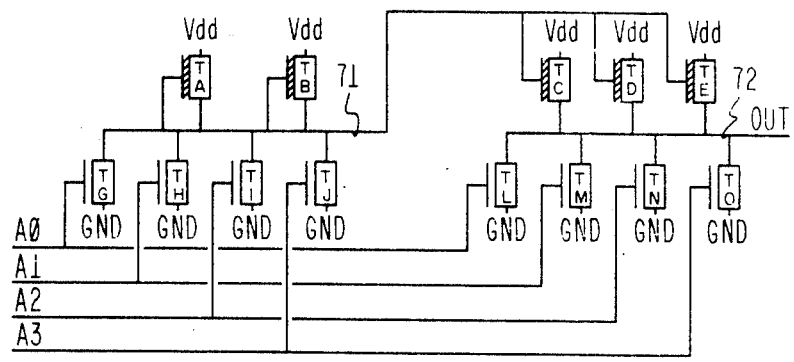
FIG. 7 is a schematic of the cell of FIG. 5, but personalized for a different power level.

FIG. 7 is a schematic of a four-input NOR gate at a higher power level. Devices TG-TJ operate as in FIG. 5, but their drains are paralleled to load devices TA-TB, at an internal node 71. The inputs are also coupled to devices TL-TO, so that output node 72 is pulled down whenever node 71 is down. At the same time, the low level on node 71 almost cuts off the three paralleled load devices TC-TE by pulling their gates to ground. When node 71 goes high, TC-TE conduct because of the high level on node 71, and devices TL-TO are cut off. Devices TC-TE and TL-TO thus form a push-pull output stage, which minimizes power dissipation.

Figure 8:
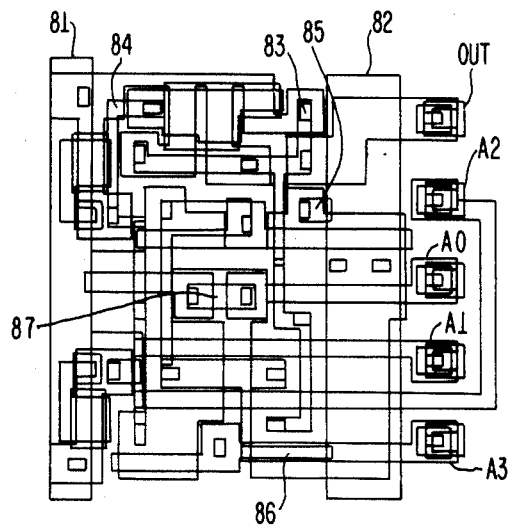
FIG. 8 is a top view of the personalized first metal layer for the cell of FIG. 7.

FIG. 8 shows the personalized M1 layer (shown shaded) for the circuit of FIG. 7. Power and ground buses 81 and 82 occupy the same positions as the corresponding buses 61 and 62 of FIG. 6. Conductor 83 couples TC-TE and TL-TO to the output node, while conductor 84 couples TA-TB and TG-TJ together and to the gates (at via V3 of FIG. 3) of TC-TE. Conductors 85-86 provide the source/drain ground connections to bus 82. Link 87 joins the gates of TG and TL as before.

Many other functions can be implemented in a single cell 12 or in groups of up to four contiguous cells. Some of the available random-logic and latching functions, along with the number of cells required and the number of different power levels available for each function, are listed in the following table.

| Random Logic Function | | Number of Cells | Number of Power Levels |
|---|---|---|---|
| NOR | (1-4 inputs) OUTPUT = A0+A1+A2+A3 | 1 | 5 |
| NOR | (2-4 inputs with the A0 input inverted) OUTPUT = (`A0)+B0+B1+B2 | 2 | 3 |
| NOR | (5-9 inputs) OUTPUT = A0+A1+A2+A3+A4+A5+A6+A7+A8 | 2 | 5 |
| OR | (1-4 inputs) OUTPUT = A0+A1+A2+A3 | 1 | 3 |
| OR | (5-9 inputs) OUTPUT = A0+A1+A2+A3+A4+A5+A6+A7+A8 | 2 | 3 |
| NAND | (2 inputs) OUTPUT = A0`A1 | 1 | 3 |
| NAND | (3-4 inputs) OUTPUT = A0`A1`A2`A3 | 2 | 3 |
| AND | (2 inputs) OUTPUT = A0`A1 | 1 | 3 |
| AND | (3-4 inputs) OUTPUT = A0`A1`A2`.A3 | 2 | 3 |
| XOR | (2 inputs exclusive OR) OUTPUT = A0 ⊕ A1 | 1 | 3 |
| XNOR | (2 input equivalence) OUTPUT = A0 ⊕ A1 | 1 | 3 |
| SELECT | 1 of 2 (selects one of two input signals) OUTPUT = (G0`A0)+(G0`B0) | 1 | 3 |
| RCG | (Ripple Carry Generator) OUTPUT = (A0`B0)+((A0+B0)`C0) | 1 | 3 |
| AO | (3-4) input AND-OR) OUTPUT = (A0`A1)+(B0`B1) | 1 | 3 |
| AO | (4-9 input AND-OR with gate) OUTPUT = (A0`A1)+(B0`B1)+(C0`C1)+ (D0`D1)+E0 | 2 | 3 |
| AOI | (3-4 input AND-OR-INVERT) OUTPUT = (A0`A1)+(B0`B1) | 1 | 3 |
| AOI | (4-9 input AND-OR-INVERT with gate) OUTPUT = (A0`A1)+(B0`B1)+C0`C1+ (D0`D1)+E0 | 2 | 3 |
| OA | (3-4 input OR-AND) OUTPUT = (A0+A1)`(B0+B1) | 1 | 3 |
| OA | (4-9 input OR-AND with gate) OUTPUT = (A0+A1+A2)`(B0+B1+B2) + C0`C1+D0 | 2 | 3 |
| OAI | (3-4 input OR-AND INVERT) | 1 | 3 |

-continued

|   |   | | |
|---|---|---|---|
| | OUTPUT = $\overline{(A0+A1)'(B0+B1)}$ | | |
| OAI | (4-9 input OR-AND-INVERT with gate)<br>OUTPUT = $\overline{(A0+A1)'(B0+B1) + C0'C1+D0}$ | 2 | 3 |
| Latch<br>Functions | | | |
| | 1-PORT POLARITY-HOLD MASTER-SLAVE LATCH<br>    Any 1, 2, or 3 of the master of slave<br>    outputs or their complements are<br>    available as outputs | 3 | 3 |
| | 2-PORT POLARITY-HOLD MASTER-SLAVE LATCH<br>    Any 1, 2, 3, or 4 of the master or<br>    slave outputs or their complements<br>    are available as outputs | 4 | 3 |
| | 1-PORT SET-RESET MASTER-SLAVE LATCH<br>    Any 1, 2, or 3 of the master or<br>    slave outputs or their complements<br>    are available as outputs | 3 | 3 |
| | POLARITY-HOLD LATCH (one phase only)<br>    Only the in-phase output is available | 1 | 3 |
| | POLARITY-HOLD LATCH (both phases)<br>    Either one or both phases are available<br>    as outputs | 2 | 3 |
| | 1-PORT POLARITY-HOLD MASTER-SLAVE LATCH WITH<br>    AN ADDITIONAL POLARITY HOLD DATA PORT<br>    ON THE SLAVE<br>    Any a, 2, 3, or 4 of the master or slave<br>    outputs or their complements are available<br>    as outputs | 4 | 3 |

Other circuits are also possible. Moreover, larger rectangular shapes or blocks of the chip can be set aside for random-access memory (RAM) or other special circuits instead of the rows of standard cells.

Figure 9:
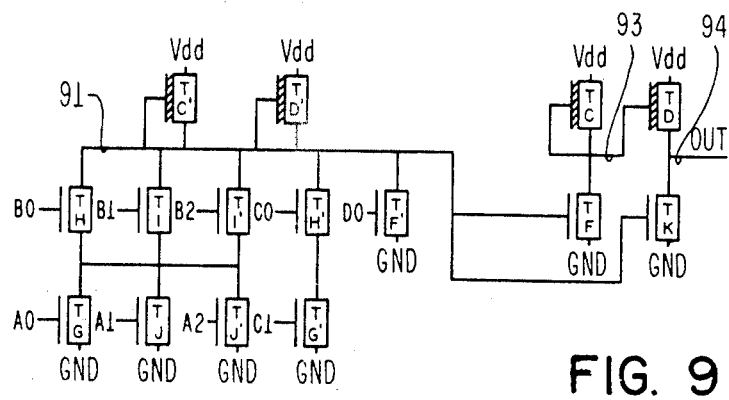
FIG. 9 is a schematic of a logic function requiring two cells.

FIG. 9 is a schematic of a two-cell macro for implementing a specific low-power nine-input OR-AND (OA) logic function:

$$\text{OUTPUT} = (A0+A1+A2)\cdot(B0+B1+B2)+(C0\cdot C1)+D0$$

Internal node 91 is held high by load transistors TC'-TD' (primes designate FETs in the second cell of the macro). Any of the B0-B2 inputs, in combination with any of the A0-A2 inputs, will ground node 91 by creating a conductive path through logic transistors TH, TI, TI', TG, TJ, TJ', using node 92. Inputs C0 and C1 together will ground node 91 through TG', TH', as will input D0 by itself through TF'. A low voltage on node 91 cuts off TF, so that load device TC holds internal node 93 high, thus turning on TD and driving output node 94 high. TF is cut off by the low level on node 91. When node 91 rises, TD almost cuts off and TK conducts to drive output 94 low. In this circuit, TD, TK form a push-pull output stage fed by an inverter TC, FT; the remaining devices form an input logic stage.

Figure 10:
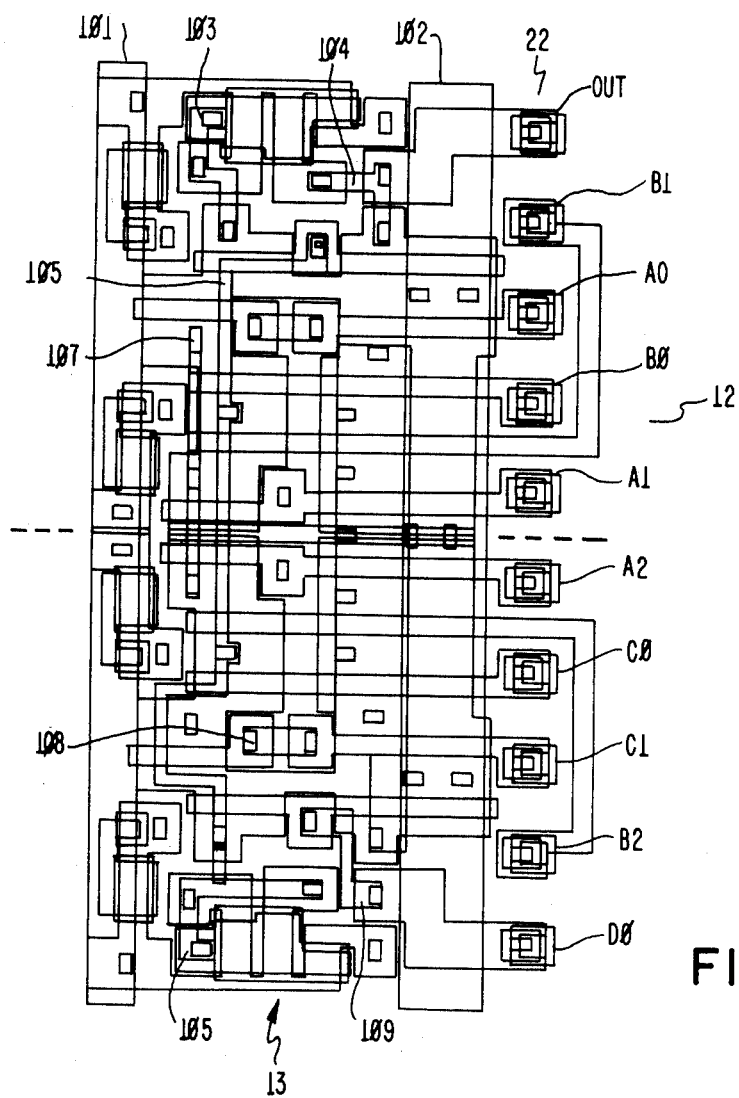
FIG. 10 is a top view of the first personalized metal layer of FIG. 9.

FIG. 10 shows the actual layout of the circuit of FIG. 9. Two mirror image cells 12 and 12' in the same row 13 share supply bus 101 and ground bus 102. Conductors 103-109 in the shaded M1 layer provide personalization. Conductors 105, 107, 103, and 104 respectively correspond to nodes 91-94 in FIG. 9. Note that 105 and 107 extend freely across the boundary between the two cells. The personalized leftward extension of ground bus 102 disables unused devices TL-TO and TK'-TO', avoiding power dissipation and noise generation. Macros requiring more than two cells are constructed similarly.

We claim as our invention:

1. A masterslice semiconductor chip carrying an array of repetitive multifunction cells, each having a substantially rectangular boundary, each of said cells comprising:
   a first series string of FETs (each having a source, a drain, and a gate electrode) all having the same polarity, said first string being disposed in a first direction;
   a second series string of FETs (each having a source, a drain, and a gate electrode) all having said same polarity, said second string also being disposed in said first direction;
   a plurality of I/O pads located on said boundary;
   a plurality of conductors disposed in a second direction substantially perpendicular to said first direction, each of said conductors connecting the gate of one FET of said first string to the gate of a corresponding FET of said second string and to one of said I/O pads;
   a plurality of internal connection points located between adjacent ones of at least some FETs of each of said first and said second strings, said internal connection points being adapted for selective interconnection among themselves and to at least one of said I/O pads;
   load means including a plurality of load FETs connected to a supply voltage and to a further plurality of internal connection points, for selective connection to the FETs of said first and second strings.

2. A chip according to claim 1, further comprising a ground bus connecting one FET of each of said first and second strings to a constant potential.

3. A chip according to claim 1, wherein each of said strings comprises at least five FETs in series.

4. A chip according to claim 3, wherein a first FET of each of said strings is connected to a constant potential, and wherein a fifth FET of each of said strings is connected to one of said internal connection points.

5. A chip according to claim 4, wherein said plurality of conductors comprises four conductors respectively connecting together the gates of a first, a second, a third, and a fifth of the FETs in said strings.

6. A chip according to claim 5, wherein said conductors connecting the gates of said first, second and third FETs are also connected respectively to three of said I/O pads.

7. A chip according to claim 3, wherein said internal connection points are located between a first and second, a second and third, and a third and fourth of the FETs in each of said first and second strings.

8. A chip according to claim 1, wherein said load means comprises a plurality of FETs each having one electrode connected to a constant potential, and having a second electrode connected to a respective one of said further plurality of internal connection points.

9. A chip according to claim 8, wherein at least some of the FETs in said load means have a gate electrode connected to the second electrode of the same FET.

10. A chip according to claim 8, wherein at least some of the FETs in said load means have gate electrode connected to each other and to a single one of the internal connection points in said further plurality.

* * * * *